(12) United States Patent
Bai et al.

(10) Patent No.: US 12,089,373 B2
(45) Date of Patent: Sep. 10, 2024

(54) METAMATERIAL HEAT SPREADER

(71) Applicant: ARRIS Enterprises LLC, Suwanee, GA (US)

(72) Inventors: Qiang Bai, Shipley (GB); Ian Clarke, Shipley (GB)

(73) Assignee: ARRIS ENTERPRISES LLC, Horsham, PA (US)

(*) Notice: Subject to any disclaimer, the term of this patent is extended or adjusted under 35 U.S.C. 154(b) by 297 days.

(21) Appl. No.: 17/668,568

(22) Filed: Feb. 10, 2022

(65) Prior Publication Data
US 2022/0264763 A1 Aug. 18, 2022

Related U.S. Application Data
(60) Provisional application No. 63/148,733, filed on Feb. 12, 2021.

(51) Int. Cl.
| | |
|---|---|
| *H05K 7/20* | (2006.01) |
| *G06F 1/18* | (2006.01) |
| *G06F 1/20* | (2006.01) |
| *G11B 33/14* | (2006.01) |

(52) U.S. Cl.
CPC .......... *H05K 7/2039* (2013.01); *G06F 1/182* (2013.01); *G06F 1/20* (2013.01); *G11B 33/1426* (2013.01); *G11B 33/1493* (2013.01)

(58) Field of Classification Search
CPC . H01L 23/552; H01L 21/4882; H01L 23/367; H01L 2223/6677; H01L 23/373; H01L 23/40; H01L 23/60; H01L 23/66; H05K 7/2039; H05K 7/20418; H05K 9/0032; H05K 1/0203; H05K 5/0004; H05K 7/2049; H05K 9/0024; H05K 9/0026; F28F 3/00; F28F 9/002; G06F 1/20; H01Q 1/526

See application file for complete search history.

(56) References Cited

U.S. PATENT DOCUMENTS

| | | | |
|---|---|---|---|
| 9,430,006 B1* | 8/2016 | Hayashida | G06F 1/203 |
| 11,187,891 B1* | 11/2021 | Moon | G02F 1/133553 |
| 2007/0086170 A1 | 4/2007 | Liang | |
| 2007/0211436 A1 | 9/2007 | Robinson et al. | |

(Continued)

FOREIGN PATENT DOCUMENTS

EP   3 391 719   10/2018

OTHER PUBLICATIONS

International Preliminary Report on Patentability and Written Opinion of the International Searching Authority mailed Aug. 24, 2023 in International Application No. PCT/US2022/015895.

(Continued)

*Primary Examiner* — Michael A Matey
(74) *Attorney, Agent, or Firm* — Wenderoth, Lind & Ponack, L.L.P.

(57) ABSTRACT

A metamaterial heat spreader includes a base, and a projection. The base is configured to be attached to a first surface of a heat generation component. The projection is continuous with and extends away from the base such that the projection is configured to be spaced apart from and overlap a second surface of the heat generation component. The projection is constituted by a metal with a periodic pattern. The projection is configured to have a high impedance surface (HIS).

20 Claims, 9 Drawing Sheets

(56) References Cited

U.S. PATENT DOCUMENTS

| | | | |
|---|---|---|---|
| 2010/0142154 A1* | 6/2010 | Collet | H05K 7/20454 |
| | | | 361/714 |
| 2013/0266326 A1* | 10/2013 | Joseph | H04B 10/1141 |
| | | | 398/130 |
| 2014/0140007 A1 | 5/2014 | Gillard et al. | |
| 2016/0100511 A1* | 4/2016 | Kurz | H05K 9/0026 |
| | | | 29/890.03 |
| 2020/0253096 A1* | 8/2020 | McBain | H05K 9/009 |
| 2020/0358445 A1* | 11/2020 | Northcutt | H03H 9/13 |
| 2022/0192055 A1* | 6/2022 | Gonzalez Inda | H05K 7/20445 |

OTHER PUBLICATIONS

International Search Report and Written Opinion of the International Searching Authority mailed May 18, 2022 in International (PCT) Application No. PCT/US2022/015895.

\* cited by examiner

Fig. 8 HDD noise distribution with and without MM-HS

METAMATERIAL HEAT SPREADER

TECHNICAL FIELD

The subject matter of the present disclosure relates generally to a metamaterial heat spreader and a device including the metamaterial heat spreader.

BACKGROUND

In devices that generate heat, a heat spreader may be utilized by these devices to dissipate that heat. For example, an electronic device (e.g., a smart speaker, Smart Media Device (SMD), wireless extender, cable modem, gateway device, set-top box (STB), personal computer (PC), customer premise equipment (CPE) device, etc.) may have one or more heat spreaders designed to transfer heat by conduction to a wider area in order to avoid hotspots.

In particular, Hard Disk Drives (HDD) are widely used in STBs and PCs, and Serial Advanced Technology Attachment (SATA) is the standardized connector for most HDDs. HDDs generally include an exposed printed circuit board (PCB), magnetic heads, a metal casing on one side, and an unshielded SATA electrical connector and cable.

Due to lack of shielding of the SATA electrical connector and cable, strong radiated Electromagnetic Interference (EMI) can propagate over air or in conducted format which in turn can cause desensitization of nearby wireless devices either co-located in the electronic device itself or located nearby.

While the SATA data transfer rate has increased to 6 Gbit/s (SATA 3.0), HDD EMI has become an even more important issue, which may severely impact wireless communication performance of an STB or any other device with an HDD and a wireless communication transceiver. HDDs are well known to have strong radiated noise emissions in the 2.4 GHz band.

It is advantageous to dissipate the heat from the HDD in order to improve long term reliability and the lifetime of the HDD. It is therefore common to add a heat sink or a heat spreader to the HDD such that heat can be conducted and radiated away from the components therein.

Existing solutions generally involve mounting a flat heat spreader on top of a circuit board, thereby allowing heat to travel away from the circuit board so as to be dispersed into cooler air. However, existing solutions do not suppress HDD EMI noise.

Thus, it would be advantageous and an improvement over existing solutions to provide a metamaterial heat spreader that both aids thermal dissipation and suppresses the radiated propagation of HDD EMI noise.

SUMMARY

A metamaterial heat spreader for use with a device (such as in an STB) is disclosed in the present application.

The device comprises:
a metamaterial heat spreader; and
a heat generation component,
wherein:
the metamaterial heat spreader includes a base, and a projection;
the base is configured to be attached to a first surface of the heat generation component;
the projection is continuous with and extends away from the base such that the projection is configured to be spaced apart from and overlap a second surface of the heat generation component;
the projection is comprised of a metal with a periodic pattern; and
the projection is configured to have a high impedance surface (HIS).

A metamaterial is a type of artificial material, which can be used to manipulate electromagnetic waves. Metamaterials are generally made from a composite metal with a periodic pattern or a plastic material with a periodic pattern. There are many forms and applications of metamaterials. In the present application, a structure with at least one projection (e.g., a finger) is integrated into a heat spreader to achieve a HIS for the 2.4 GHz radio wave band.

By precisely defining metal structure geometry and arrangement, the metamaterial heat spreader can block HDD EMI noise propagating in certain directions while simultaneously aiding HDD heat dissipation.

BRIEF DESCRIPTION OF THE DRAWINGS

In the drawings, like reference numbers generally indicate identical, functionally similar, and/or structurally similar elements.

DETAILED DESCRIPTION

Exemplary embodiments will be described in detail below with reference to the drawings. The description and drawings are provided so that a person skilled in the art can fully understand the present disclosure and are not intended to limit the subject matter recited in the claims.

The metamaterial heat spreader and device disclosed herein both aid thermal dissipation and suppress the radiated propagation of HDD EMI noise.

The metamaterial heat spreader and device disclosed herein address and solve the following problems:

How to provide maximum surface area for dissipating heat.
How to avoid trapping of heat underneath a heat spreader.
How to prevent overheating of higher-temperature components of an HDD.
How to aid thermal dissipation from an HDD.
How to suppress the radiated propagation of HDD EMI noise.

How to leverage the solution to the above-mentioned problems in a heat spreader with a minimal number of parts in a minimal amount of space.

The metamaterial heat spreader and device disclosed herein solve the problems identified above and provide an efficient and cost effective solution to aid thermal dissipation and suppress the radiated propagation of HDD EMI noise.

The metamaterial heat spreader disclosed herein transfers heat into colder air and releases the heat away from the HDD.

Described herein is a metamaterial heat spreader that may be located in a device that has an HDD and may be co-located with a wireless communication transceiver with antennas to facilitate heat transfer through both convection and conduction.

Figure 1:
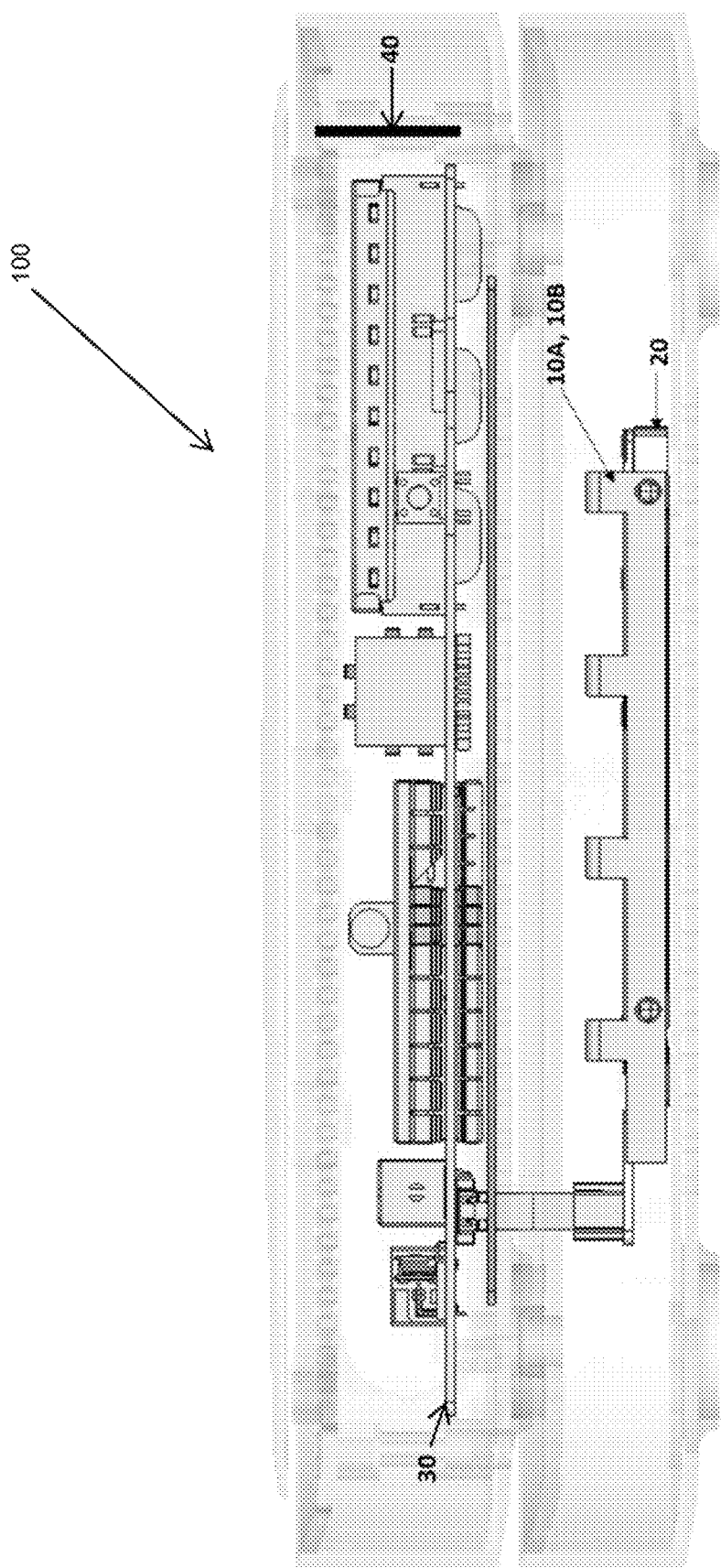
FIG. 1 is a front perspective view of an example device according to the present disclosure.

FIG. 1 is a front perspective view of an example device 100 according to the present disclosure. The device 100 can be, for example, an STB. The device 100 may comprise a metamaterial heat spreader 10A and/or 10B, a heat generation component 20 (such as an HDD), a main PCB 30 and a Wi-Fi 2 antenna 40.

Figure 2:
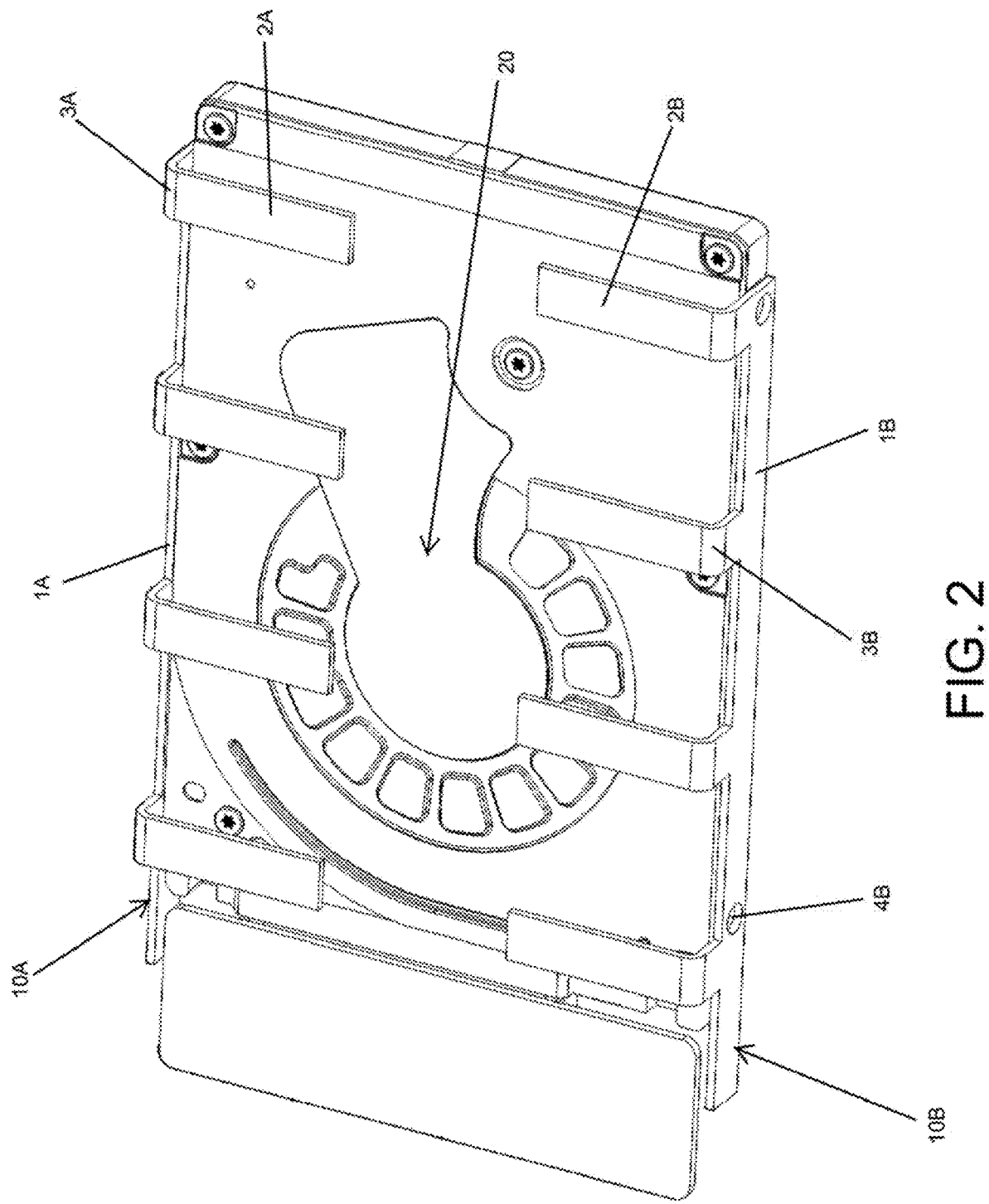
FIG. 2 is a front perspective view of a portion of the example device according to the present disclosure.

FIG. 2 is a front perspective view of a portion of the example device 100 according to the present disclosure. The metamaterial heat spreader 10A includes a base 1A, and at least one projection 2A. The base 1A is configured to be attached to a first surface (e.g., side surface) of the heat generation component 20. The projection 2A is continuous with and extends away from the base 1A such that the projection 2A is configured to be spaced apart from and overlap a second surface (e.g., top surface) of the heat generation component 20. The projection 2A is comprised of a metal with a periodic pattern. The projection 2A is configured to have a HIS. An HIS is a surface having a bandwidth defined as the frequency range where the absolute value of the impedance is larger than the free-space impedance.

A metamaterial refers to a basic material formed in regular, periodic shapes such that the material is changed from its typical function. In other words, a metamaterial is designed to have a property which is not present in naturally occurring materials. A mechanical metamaterial exhibits mechanical properties derived from its artificially designed structure. An acoustic metamaterial has acoustic properties which are not found in nature.

In the present disclosure, for example, instead of conducting electromagnetic (EM) waves as a conventional metal does, the metamaterial heat spreader 10A can suppress EM waves propagating along the metal surface thereof, while still providing thermal relief as a heat spreader. The metamaterial heat spreader 10A may be comprised of steel, aluminum, or any other conductive metal material.

EM metamaterial normally includes periodic shapes, which are called unit cells. Each unit cell is smaller than the wavelength of the target frequency band and precisely designed to have suitable inductive and capacitive characteristics which can maximize the interaction between the unit cell and the EM wave at desired frequencies.

Some fundamental shapes are widely used to build EM metamaterial unit cells, such as patch, finger strip, slot, cross and split rings. Based on the fundamental shapes, a number of variations, such as zigzag, cone, gradient, helix, etc., can be further included to reduce the unit cell size or increase operating frequency bandwidth or support multiple frequency bands. The metamaterial heat spreader has been designed with manufacturability in mind. A simple formation of regular rectangular and/or arcuate protrusions simplifies the mechanical tooling required to manufacture such a structure. The simplified unit cell structure improves repeatability, tolerance and reliability of the metamaterial properties and reduces the cost of the manufacturing process.

In some variations, the heat generation component 20 is an HDD. The projection 2A may be one of a plurality of projections 2A spaced apart from one another. In some variations, the projection 2A is one of four projections 2A spaced apart from one another. Each projection 2A may be perpendicular to the base 1A. A portion 3A of each projection 2A may be arcuate.

In some variations, the base 1A is a first base 1A, the projection 2A is a first projection 2A and the metamaterial heat spreader 10A, 10B further comprises a second base 1B and a second projection 2B such that the metamaterial heat spreader 10A, 10B includes two separate elements on different sides of the heat generation component 20. The second base 1B is configured to be attached to a third surface (e.g., another side surface) of the heat generation component 20. The second projection 2B is continuous with and extends away from the second base 1B such that the second projection 2B is configured to be spaced apart from and overlap the second surface (e.g., top surface) of the heat generation component 20. A portion 3B of each projection 2B may be arcuate. The first base 1A may be parallel to the second base 1B. The first base 1A may include an aperture 4A for a fastener (e.g., an HDD screw). Similarly, the second base 1B may include an aperture 4B for a fastener (e.g., an HDD screw).

The first surface of the heat generation component may be a side surface and the second surface of the heat generation component may be a top surface which is perpendicular to the side surface. In other words, the first base 1A may be attached to one side surface of the heat generation component 20, the second base 1B may be attached to another side surface of the heat generation component 20, and the first projection 2A and the second projection 2B may overlap the top surface of the heat generation component 20.

Figure 3:
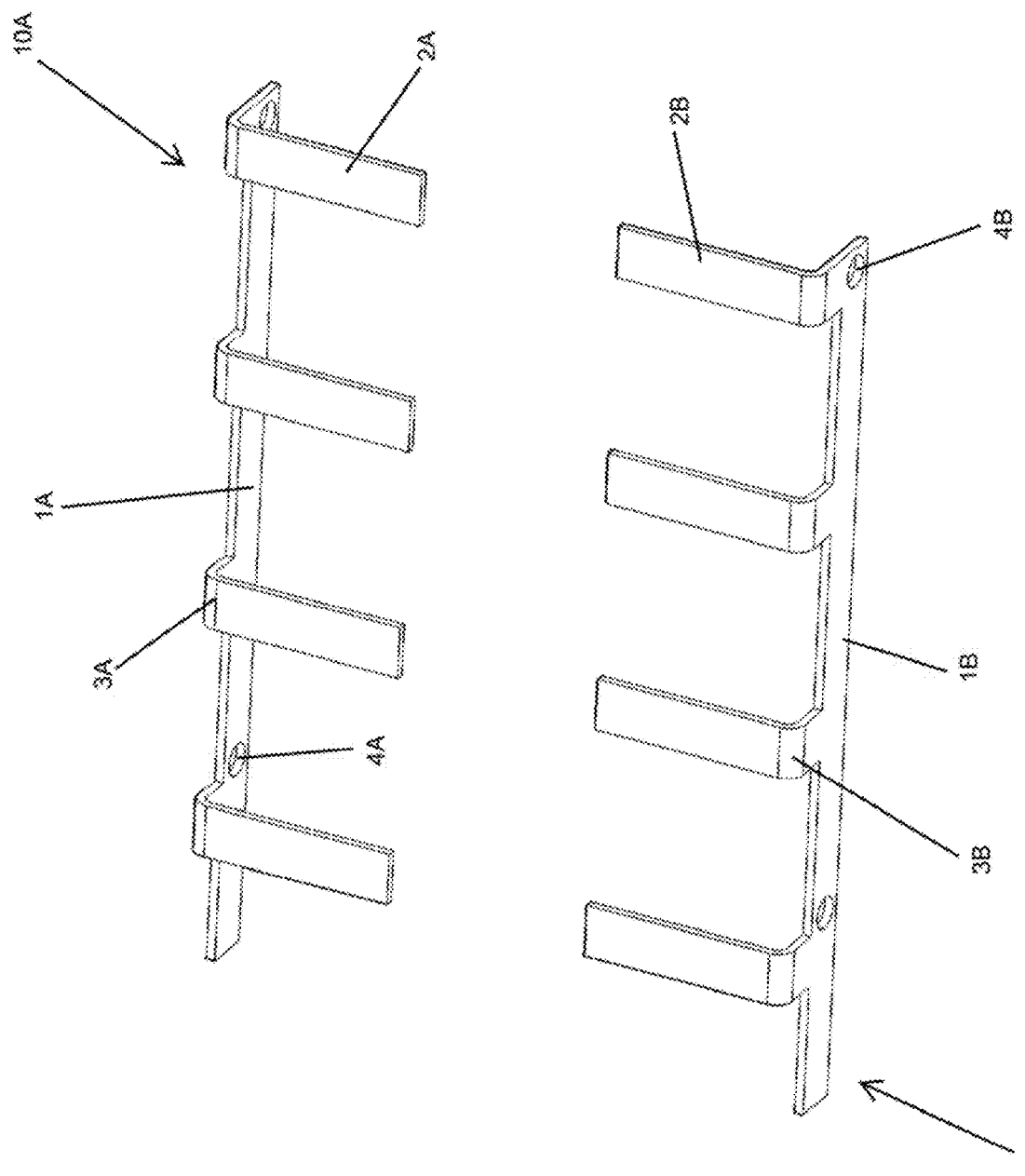
FIG. 3 is a front perspective view of a metamaterial heat spreader according to the present disclosure.

FIG. 3 is a front perspective view of a metamaterial heat spreader 10A, 10B according to the present disclosure.

As shown in FIG. 3, the metamaterial heat spreader 10A, 10B includes two separate elements on different sides of the heat generation component 20 and each includes four projections 2A, 2B. This arrangement of eight total projections 2A, 2B provides an optimal configuration whereby the first pair of projections 2A, 2B reflects and cancels EMI noise in the 2.4 GHz radio wave band, the second pair of projections 2A, 2B and the third pair of projections 2A, 2B provide second and third stages of EMI noise cancellation, and the fourth pair of projections 2A, 2B provides protection against residual HDD EMI noise propagation. Accordingly, a characteristic of a multi-stage band-stop filter is emulated.

As shown in FIG. 3, the projections 2A are perpendicular to the base 1A and the projections 2B are perpendicular to the base 1B. This arrangement provides the maximum surface area for absorbing radio waves and yields the maximum performance for noise suppression and heat dissipation.

In an example configuration, each of the projections 2A may be 21 mm apart from one another; a length of each of the projections 2A may be 22 mm and each of the projections 2A may be 5 mm from the top surface of the HDD 20. Similarly, each of the projections 2B may be 21 mm apart from one another; a length of each of the projections 2B may be 22 mm and each of the projections 2B may be 5 mm from the top surface of the HDD 20.

Figure 4:
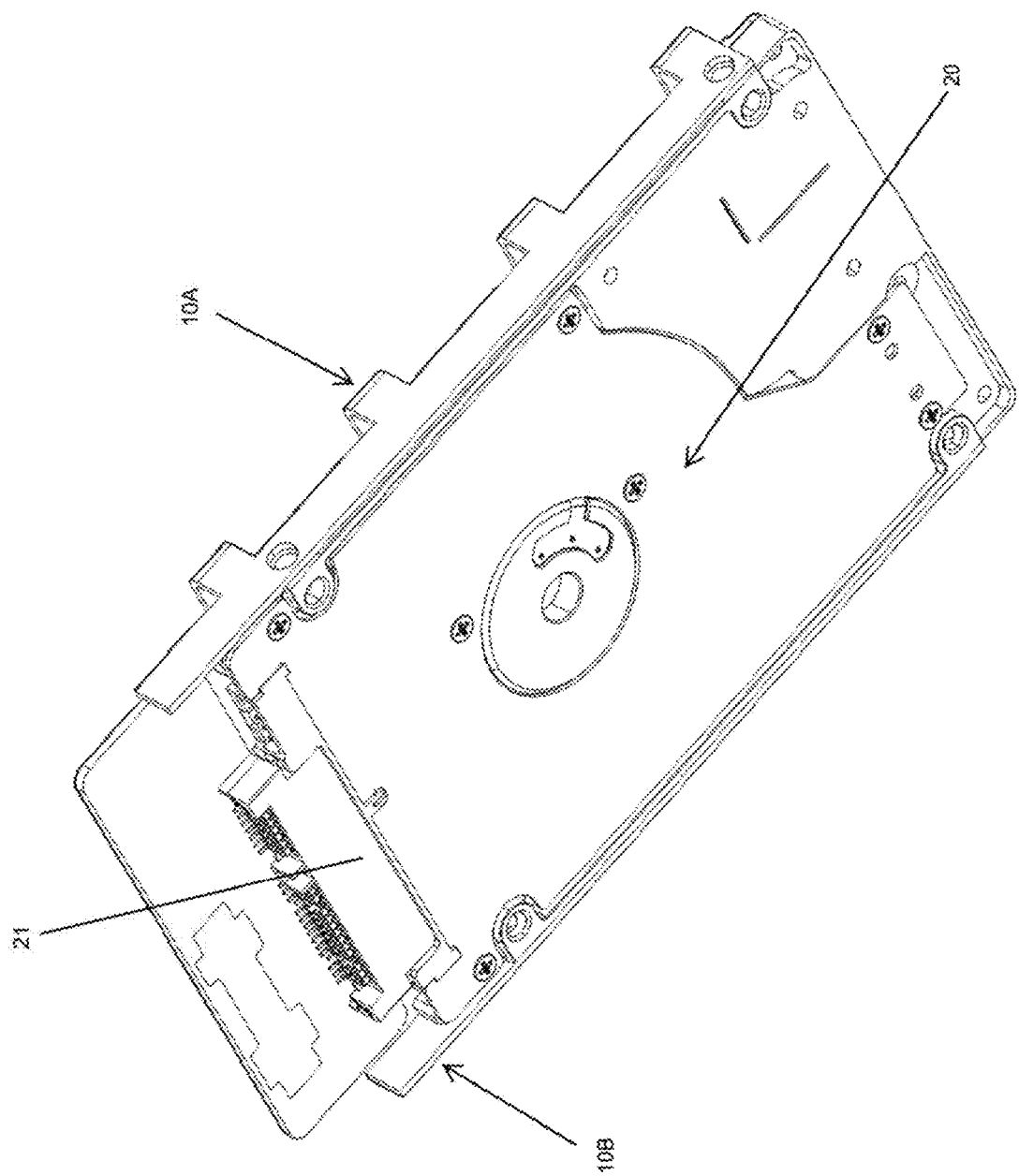
FIG. 4 is a rear perspective view of the portion of the example device according to the present disclosure.

FIG. 4 is a rear perspective view of the portion of the example device according to the present disclosure. The heat generation component 20 may include a SATA connector 21. Typically, the SATA connector 21 is unshielded which leads to more leakage, emission of high frequency noise, and noise from both the exposed PCB of the HDD 20 and the SATA connector 21. Due to the mechanical limitations of the HDD and SATA connector structures, it is not practical to shield the whole HDD device 20 and SATA cable to prevent EMI emissions. In other words, it is not possible to add a full metal Faraday cage around the radiating component (HDD 20) and SATA cable due to cost and ventilation/thermal issues.

Figure 5:
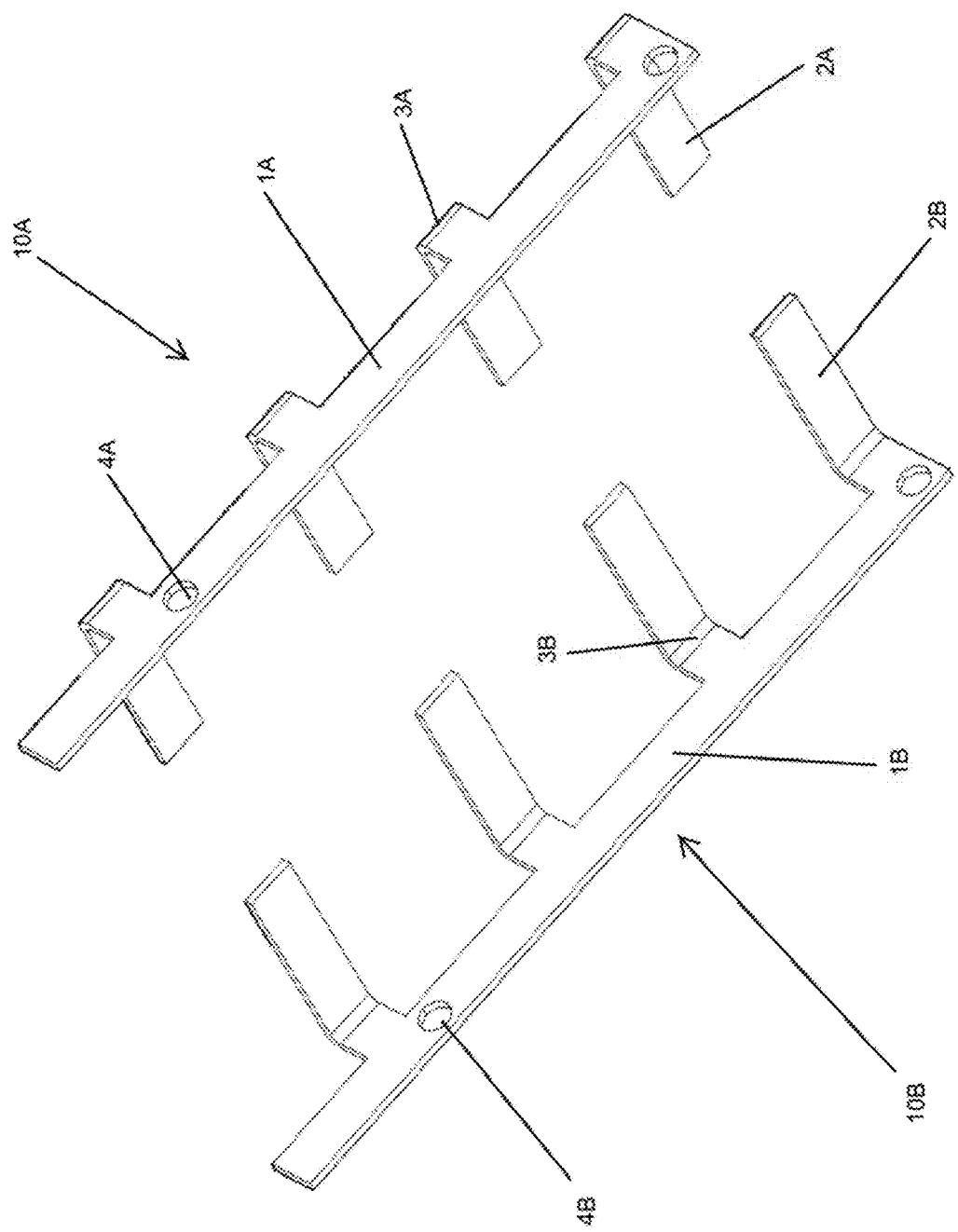
FIG. 5 is a rear perspective view of the metamaterial heat spreader according to the present disclosure.

FIG. 5 is a rear perspective view of the metamaterial heat spreader according to the present disclosure. As shown in FIG. 5, the metamaterial heat spreader includes two identical elements 10A, 10B.

Figure 6:
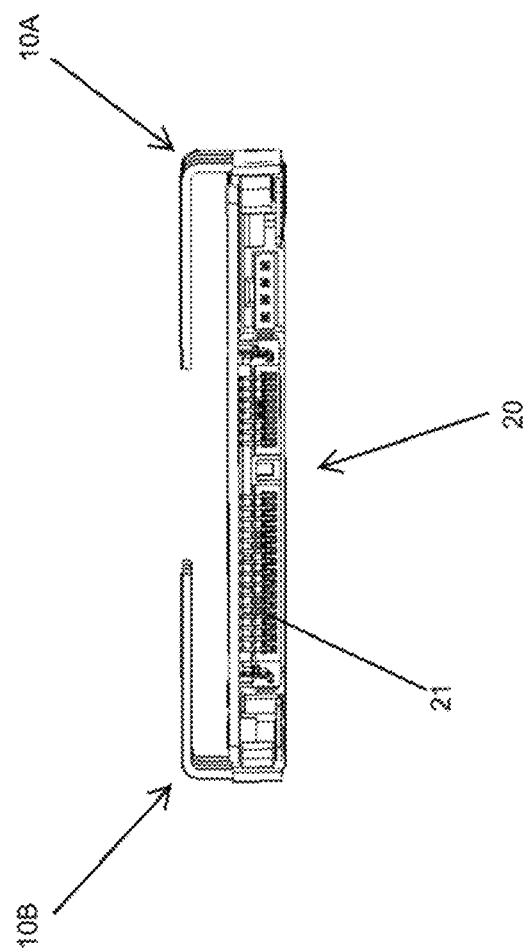
FIG. 6 is a side view of the portion of the example device according to the present disclosure.

FIG. 6 is a side view of the portion of the example device according to the present disclosure. As shown in FIG. 6, the metamaterial heat spreader 10A, 10B is configured to suppress HDD noise leaks from the SATA connector 21, and prevent propagation of the HDD noise leaks along the metal surface of the HDD 20.

Figure 7:
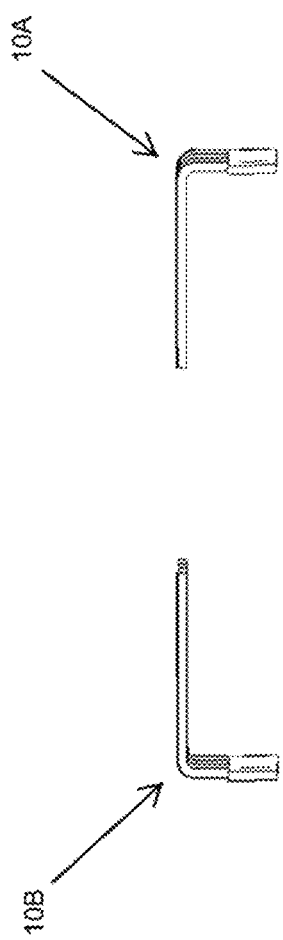
FIG. 7 is a side view of the metamaterial heat spreader according to the present disclosure.

FIG. 7 is a side view of the metamaterial heat spreader according to the present disclosure. As shown in FIG. 7, the metamaterial heat spreader includes two identical elements 10A, 10B.

Figure 8:
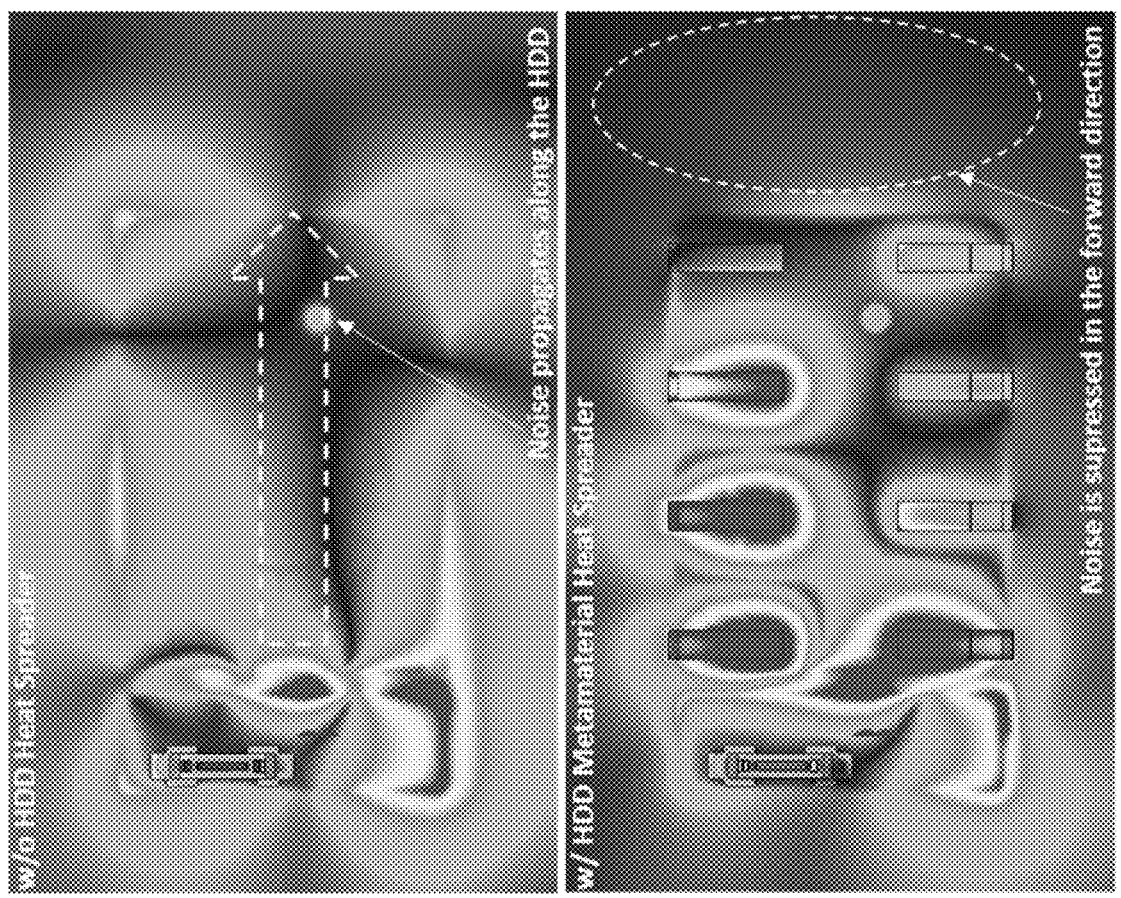
FIG. 8 shows images of HDD noise distribution with and without the metamaterial heat spreader according to the present disclosure.

FIG. 8 shows images of HDD noise distribution with and without the metamaterial heat spreader according to the present disclosure. The top image represents HDD noise distribution for an HDD alone and the bottom image represents HDD noise distribution for an HDD with the metamaterial heat spreader of the present disclosure. In one example device, three antennas 40 are required for the radio frequency (RF) system and there is a 2.5 inch HDD 20 under the main PCB 30 (see FIG. 1). From detailed simulations, it was evident that HDD noise leaked from the SATA connector 21, and propagated along the HDD metal surface thereby negatively impacting the Wi-Fi 2 antenna area 40. The metamaterial structure is integrated into the heat spreader 10A, 10B to create a HIS which will block or cancel HDD noise propagation along the HDD 20 and towards a Wi-Fi 2 antenna 40. As shown in FIG. 8, the metamaterial heat spreader 10A, 10B clearly suppresses noise in the forward direction, for example.

Figure 9:
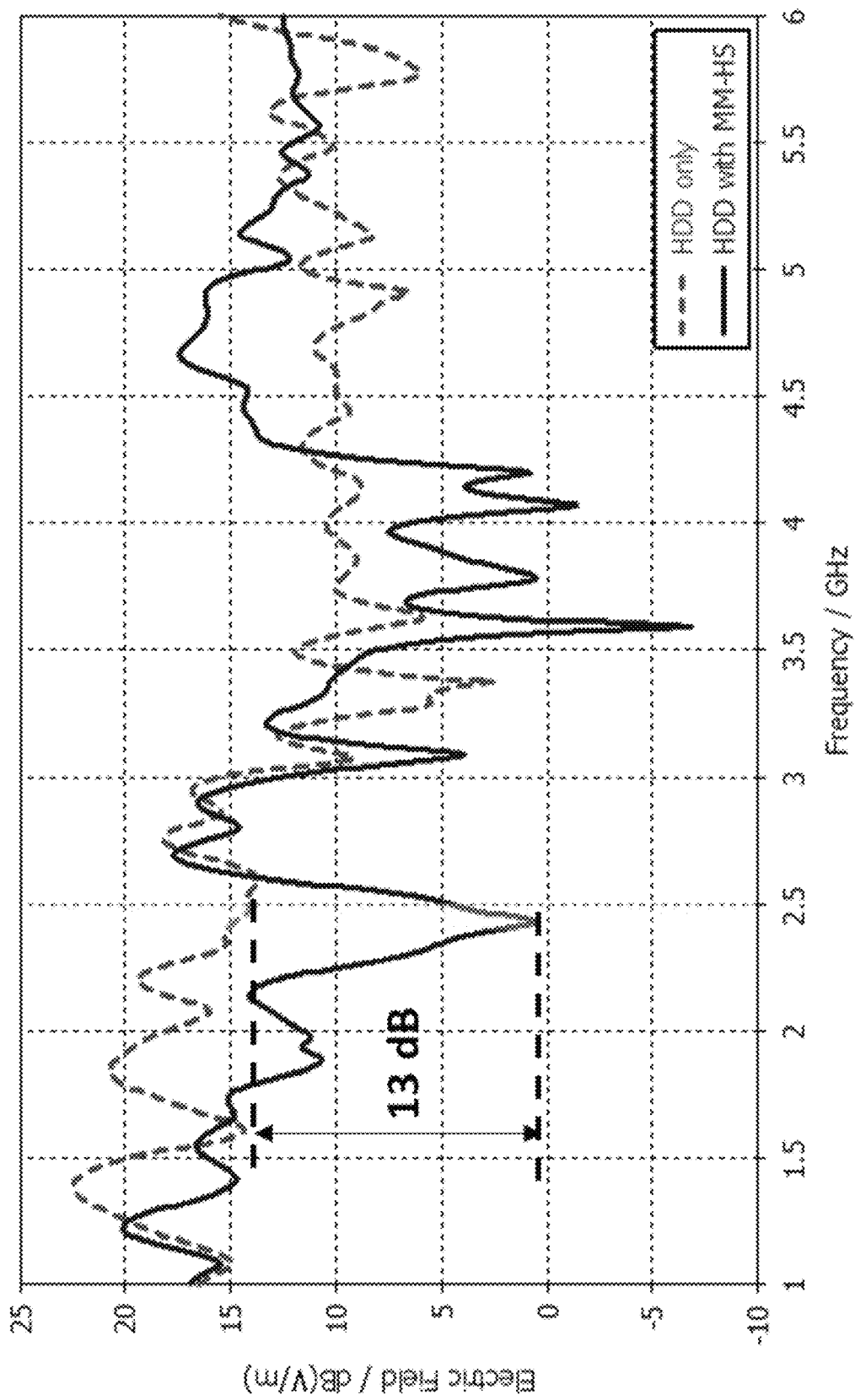
FIG. 9 shows a graph of HDD noise levels at a location of a Wi-Fi 2 antenna with and without the metamaterial heat spreader according to the present disclosure.

FIG. 9 shows a graph of HDD noise levels at a location of a Wi-Fi 2 antenna 40 with and without the metamaterial heat spreader 10A, 10B according to the present disclosure. An E-field probe was used to monitor the HDD EMI Field power (measured in dBV/m) at the location of the Wi-Fi 2 antenna 40. The dashed line represents HDD noise levels for an HDD alone and the solid line represents HDD noise levels for an HDD with the metamaterial heat spreader 10A, 10B of the present disclosure. As shown in FIG. 9, at the same location, the HDD EMI field power can be reduced by up to 13 dB in the 2.4 GHz band when using the metamaterial heat spreader 10A, 10B of the present disclosure. The metamaterial structure can be used to manipulate the noise propagation direction and create an EMI quiet zone. The metamaterial structure can be used to provide thermal relief for the HDD by conducting and radiating excess heat. By integrating the metamaterial structure into the heat spreader 10A, 10B, this dual purpose aspect facilitates a lower cost, higher performance product.

The subject matter of the present disclosure is provided as examples of devices, systems, methods, and programs for performing the features described in the present disclosure. However, further features or variations are contemplated in addition to the features described above. It is contemplated that the implementation of the components and functions of the present disclosure can be done with any newly arising technology that may replace any of the above implemented technologies.

Additionally, the above description provides examples, and is not limiting of the scope, applicability, or configuration set forth in the claims. Changes may be made in the function and arrangement of elements discussed without departing from the spirit and scope of the disclosure. Various embodiments may omit, substitute, or add various procedures or components as appropriate. For instance, features described with respect to certain embodiments may be combined in other embodiments.

In view of the above, the metamaterial heat spreader and device disclosed herein solve the problems of existing solutions and provide an efficient and cost effective solution to aid thermal dissipation and suppress the radiated propagation of HDD EMI noise.

We claim:

1. A device comprising:
a metamaterial heat spreader; and
a heat generation component,
wherein:
the metamaterial heat spreader includes a base, and a projection;
the base is configured to be attached to a first surface of the heat generation component;
the projection is continuous with and extends away from the base such that the projection is configured to be spaced apart from and overlap a second surface of the heat generation component;
the projection is comprised of a metal, the metal having a periodic pattern; and
the projection is configured to have a high impedance surface (HIS).

2. The device of claim 1, wherein the heat generation component is a hard disk drive (HDD).

3. The device of claim 1, wherein the projection is one of a plurality of projections spaced apart from one another.

4. The device of claim 1, wherein the projection is one of four projections spaced apart from one another.

5. The device of claim 1, wherein the projection is perpendicular to the base.

6. The device of claim 1, wherein a portion of the projection is arcuate.

7. The device of claim 1, wherein:
the base is a first base and the projection is a first projection;
the metamaterial heat spreader further comprises a second base and a second projection;
the second base is configured to be attached to a third surface of the heat generation component; and
the second projection is continuous with and extends away from the second base such that the second projection is configured to be spaced apart from and overlap the second surface of the heat generation component.

8. The device of claim 7, wherein the first base is parallel to the second base.

9. The device of claim 1, wherein the base includes an aperture for a fastener.

10. The device of claim 1, wherein the first surface is a side surface and the second surface is a top surface which is perpendicular to the side surface.

11. A metamaterial heat spreader comprising:
a base; and
a projection,
wherein:
the base is configured to be attached to a first surface of a heat generation component;
the projection is continuous with and extends away from the base such that the projection is configured to be spaced apart from and overlap a second surface of the heat generation component;
the projection is comprised of a metal, the metal having a periodic pattern; and
the projection is configured to have a high impedance surface (HIS).

12. The metamaterial heat spreader of claim 11, wherein the heat generation component is a hard disk drive (HDD).

13. The metamaterial heat spreader of claim 11, wherein the projection is one of a plurality of projections spaced apart from one another.

14. The metamaterial heat spreader of claim 11, wherein the projection is one of four projections spaced apart from one another.

15. The metamaterial heat spreader of claim 11, wherein the projection is perpendicular to the base.

16. The metamaterial heat spreader of claim 11, wherein a portion of the projection is arcuate.

17. The metamaterial heat spreader of claim 11, wherein:
the base is a first base and the projection is a first projection;
the metamaterial heat spreader further comprises a second base and a second projection;
the second base is configured to be attached to a third surface of the heat generation component; and
the second projection is continuous with and extends away from the second base such that the second projection is configured to be spaced apart from and overlap the second surface of the heat generation component.

18. The metamaterial heat spreader of claim 17, wherein the first base is parallel to the second base.

19. The metamaterial heat spreader of claim 11, wherein the base includes an aperture for a fastener.

20. The metamaterial heat spreader of claim 11, wherein the first surface is a side surface and the second surface is a top surface which is perpendicular to the side surface.

* * * * *